(12) United States Patent
Kobashi

(10) Patent No.: US 10,937,779 B2
(45) Date of Patent: Mar. 2, 2021

(54) SEMICONDUCTOR DEVICE, DISPLAY DEVICE, AND ELECTRONIC APPARATUS

(71) Applicant: 138 East LCD Advancements Limited, Dublin (IE)

(72) Inventor: Yutaka Kobashi, Fujimichou (JP)

(73) Assignee: 138 East LCD Advancement Limited, Dublin (IE)

( * ) Notice: Subject to any disclaimer, the term of this patent is extended or adjusted under 35 U.S.C. 154(b) by 211 days.

(21) Appl. No.: 16/242,709

(22) Filed: Jan. 8, 2019

(65) Prior Publication Data

US 2019/0148353 A1 May 16, 2019

Related U.S. Application Data

(63) Continuation of application No. 14/564,759, filed on Dec. 9, 2014, now Pat. No. 10,181,462, which is a continuation of application No. 12/436,335, filed on May 6, 2009, now Pat. No. 9,184,157, which is a continuation of application No. 11/101,450, filed on Apr. 8, 2005, now Pat. No. 7,755,875.

(30) Foreign Application Priority Data

Jul. 5, 2004 (JP) .................. 2004-198040

(51) Int. Cl.
*H01L 27/02* (2006.01)
*G09G 3/3225* (2016.01)
*G09G 3/36* (2006.01)
*G02F 1/1362* (2006.01)
*G09G 3/3208* (2016.01)
*H01L 27/12* (2006.01)

(52) U.S. Cl.
CPC .... *H01L 27/0251* (2013.01); *G02F 1/136204* (2013.01); *G09G 3/3208* (2013.01); *G09G 3/3225* (2013.01); *G09G 3/36* (2013.01); *G09G 3/3648* (2013.01); *H01L 27/1214* (2013.01); *G09G 2300/043* (2013.01); *G09G 2300/0819* (2013.01); *G09G 2330/04* (2013.01); *H01L 27/12* (2013.01)

(58) Field of Classification Search
CPC .......... H01L 27/0251; G02F 1/136204; G09G 3/3225
See application file for complete search history.

(56) References Cited

U.S. PATENT DOCUMENTS 5,606,340 A * 2/1997 Suzuki ................ G09G 3/3688
345/87
6,333,769 B1 12/2001 Suzuki et al.
6,388,719 B1 * 5/2002 Matsunaga ....... G02F 1/136204
349/153

(Continued)

*Primary Examiner* — Scott Bauer
(74) *Attorney, Agent, or Firm* — Kunzler Bean & Adamson

(57) ABSTRACT

To prevent an electrostatic damage on a display device formed with a driving circuit. Protective circuits are provided not only at input terminal parts, but also at intermediate parts of a circuit or at the ends of wiring lines. Otherwise, the protective circuits are provided at the ends of the wiring lines and at the places immediately before and after the input terminals, respectively, and then the circuit is interposed therebetween. Further, the protective circuits are provided around a circuit with a large current consumption.

18 Claims, 8 Drawing Sheets

(56) References Cited

U.S. PATENT DOCUMENTS

| | | | | |
|---|---|---|---|---|
| 6,476,789 B1 * | 11/2002 | Sakaguchi | ........... | G09G 3/3677 |
| | | | | 345/100 |
| 6,825,826 B1 * | 11/2004 | Mikami | ............... | G09G 3/3688 |
| | | | | 345/98 |
| 6,838,700 B2 * | 1/2005 | Trainor | ............. | G02F 1/136204 |
| | | | | 257/360 |

* cited by examiner

SEMICONDUCTOR DEVICE, DISPLAY DEVICE, AND ELECTRONIC APPARATUS

This application is a Continuation of U.S. patent application Ser. No. 14/564,759, filed on Dec. 9, 2014, now U.S. Pat. No. 10,181,462 which issued on Jan. 15, 2019, which is a Continuation of U.S. patent application Ser. No. 12/436,335, filed on May 6, 2009, now U.S. Pat. No. 9,184,157 which issued on Nov. 10, 2015, which is a Continuation of U.S. patent application Ser. No. 11/101,450, filed on Apr. 8, 2005, now U.S. Pat. No. 7,755,875 which issued on Jul. 13, 2010, which claims priority to JP2004-198040 filed on Jul. 5, 2004, all of which are incorporated herein by reference in their entirety.

BACKGROUND

The present invention relates to a semiconductor device, display device and electronic apparatus, and more particularly, to a display device having a driving circuit provided on an active matrix substrate.

In a semiconductor device, it is important to take measure against the electro-static damages (ESD) when a high voltage caused by a static electricity or a various noise phenomenon is unintentionally applied to the inside of the device to damage an insulating film, thereby causing a fatal damage to the device. In order to prevent the problem, various protective circuits have been proposed. For example, in Patent Documents 1 and 2, it has been proposed that an abnormal voltage applied to lines is discharged to GND, etc. by proper combination of diodes. However, since general semiconductor devices are formed on a silicon wafer made of conductive material, there are little chances of being electrified within the semiconductor device, so that it is a key issue to prevent the damage when a static electricity flows through input terminals. To solve such a problem, conventionally, protective circuits are formed between input terminals and the semiconductor device forming a circuit, i.e., immediately after the input terminals, so that it is prevented that the high voltage from the input terminals is transmitted to the device.

On the other hand, in a display device using an active element such as a thin film transistor (TFT), which has been rapidly spread in recent years, a device is formed on an insulating substrate. As a result, there is a problem in that it is easy that the device is easily electrified by static electricity, and that the electro-static damage is generated during the manufacturing process. On this account, for example, an electro-static measure is taken by forming an antistatic line, called as a guide ring or a short ring, at the periphery of an active matrix circuit.

In recent years, a display device having a built-in driving circuit has been widely spread, in which an improvement of a definition, a cost reduction and better reliability are realized by using a polysilicon TFT having polysilicon serving as an active layer. In such a device, as a measure against the static electricity of the driving circuit, a conventional method used in a semiconductor on a silicon wafer is applied as it is, so that only protective circuits for preventing the static electricity from the input terminals are built in, and a conventional method of a display device not having the built-in driving circuit is used to protect the active matrix circuit from the static electricity. Hereinafter, the conventional art relating to the protection of the driving circuit will be described in detail with respect to FIG. 11.

FIG. 11 is a view illustrating a configuration of an active matrix substrate of a VGA-LCD using polysilicon TFT by the conventional art. Reference numerals 201-1 to 201-480 indicate scanning lines of the active matrix circuit, driven by a scanning line driving circuit 800. Reference numerals 202-1 to 202-1920 indicate data lines, and pixel transistors 401 composed of n-type transistors and pixel electrodes 402 are formed at intersections of the scanning lines and the data lines, respectively, to drive a liquid crystal device.

Reference numerals 801-1 to 801-480 indicate scanning line driving unit circuits composed of 480 stages, which form the scanning line driving circuit 800, and each of them is composed by a CMOS circuit. A specific configuration of the scanning line driving unit circuits 801-1 to 801-$n$ is shown in FIG. 5.

Each of the scanning line driving unit circuits 801-1 to 801-480 is connected to a low potential power line 750 and a high potential power line 751, through which power is supplied. The low potential power line 750 is connected to a low potential power terminal 650, the high potential power line 751 is connected to a high potential power terminal 651. Also, the low potential power terminal 650 and the high potential power terminal 651 are connected to a power IC through a FPC, and they are supplied with reference potentials of a potential VS and a potential VD, respectively. Herein, VS is less than VD.

Further, a signal (for example, a clock signal) required for the operation of each of the scanning line driving unit circuits 801-1 to 801-480 are supplied from an external IC through signal lines 701 and 702 and signal terminals 601 and 602.

Here, in order to prevent TFTs constituting each of the scanning line driving unit circuits 801-1 to 801-480 from being damaged by the static electricity or noise current input through the low potential power terminal 650, the high potential power terminal 651 and the signal terminals 601 and 602, static electricity protection circuits ESD1 to ESD4 are provided between the input terminals 601, 650 and 651 and the scanning line driving unit circuits 801-1 to 801-480, respectively. A specific configuration of the static electricity protection circuit ESD1 to ESD4 is shown in Patent Document 1 and Patent Document 2.

[Patent Document 1] Japanese Patent No. 2884946
[Patent Document 2] Japanese Patent No. 3141511

However, in the driving circuit on an insulating substrate, it is difficult for charges to escape as compared to the circuit on silicon wafer, and it is easy to be electrified. In addition, in the case that the driving circuit of the display device is formed on a glass substrate, the area of the circuit is larger as compared to the IC formed on a general silicon wafer. Therefore, in such a configuration, there is a problem in that a protection of the wiring lines far from the input terminals against the static electricity is not sufficient, especially during a manufacturing process. Specifically, since there is a possibility that the static electricity is electrified on a certain location on the substrate during the manufacturing process, when the distance from the electrified location to the static electricity protection circuit is long and the line resistance is high, a transistor within a circuit located closer than the static electricity protection circuit is damaged by the static electricity even before the static electricity protection circuit starts the operation. Such a problem is the same in a semiconductor device using a SOI substrate.

Further, in a case of an insulating substrate, a large current may flow in the wiring lines by electrostatic induction when strong electrostatic discharge occurs in the outside of the substrate even in a finished product state after completion of the manufacturing process. Even in such a case, there is a possibility that a circuit located far from the terminal is damaged.

Furthermore, the present invention provides a measure against the problem in that potentials on the wiring lines are instantaneously changed, when a large amount of current flows in the wiring lines through a circuit.

SUMMARY

In order to solve the above problems, it is proposed that a semiconductor circuit be disposed between protective circuits and input terminals. More specifically, it is proposed that an electrical resistance between a connection part connecting the semiconductor circuit to wiring lines and input terminals be lower than an electrical resistance between a connection part connecting the protective circuits to the wiring lines and the input terminals.

Thus, there is an effect that the protection against the static electricity is sufficiently obtained even in a place far from the terminal, by providing internal protective circuits in an area which is not connected to the input terminals of the wiring lines as well as providing the protective circuits around the input terminals as in the conventional art.

Further, it is proposed that a plurality of the protective circuits are arranged on the wiring lines and the semiconductor circuit is interposed between the protective circuits. Thereby, it is possible to prevent the static electricity or noise input from the input terminals, and to protect a semiconductor circuit far from the input terminals. In addition, it is preferable that the plurality of the protective circuits be arranged with a predetermined gap therebetween, thereby the entire part of the semiconductor circuit connected to the wiring lines can be protected.

Furthermore, in the present invention, it is proposed that the wiring line include a low potential power line and a high potential power line, and the protective circuits between power sources connected to both of the low potential power line and the high potential power line is comprised. In this configuration, the protective circuit can be easily formed by a diode element, etc., and since all are power lines, it is difficult to be affected by the noise. Also, in general, the power line is remarkably lengthened within a circuit, so that it requires a static protection more than other lines. Therefore, the effect is remarkable. In addition to this, for a signal line, it is proposed that the protective circuits between signal power sources be formed between the power lines. Since it is easy to be affected by the noise between the signal lines, it is possible to reduce an adverse influence by providing the protective circuit between the power source and the signal line. Also, it is proposed that the capacitance of the protective circuits between signal power sources be lower than the capacitance of the protective circuits between the power sources. In this way, it is possible to minimize an influence on the power line by the signal.

Further, in the present invention, the capacitive component between the wiring lines in the protective circuits is not less than $I \times t \times 0.1$ (F) when the maximum current flowing in the low potential power line or the high potential power line is I(A) and the maximum tolerable time when a voltage drop in power line occurs is t (second). t is preferably below $10^{-8}$ (second) in consideration of general operation time in a polysilicon TFT. Thereby, when a large amount of current flows in the circuit and a supply from the outside is not sufficient to follow it to generate instantaneous voltage changes on the wiring lines, there is an effect that the voltage changes are reduced by the capacitive components within the protective circuits.

Further, in the present invention, it is proposed that the protective circuit between power sources or the protective circuit between signal power sources include a diode element, and one end of the diode element is connected to the power line. In this configuration, the static electricity or the noise current is easily discharged, so that the protective performance is remarkably improved.

Further, in the present invention, it is proposed that contents of the invention described above is applied to a so-called CMOS type semiconductor device, which is composed of an n-channel type field effect transistor and a p-channel type field effect transistor. Because the CMOS type semiconductor device requires at least 2 types of reference power source, the number of power line is increased, so that the effect of this invention is remarkable. Particularly, in the CMOS type semiconductor device composed of the polysilicon thin film transistor, the substrate is an insulating substrate, and thus electrification easily occurs under a state in which there is no protective circuit, so that the effect of the present invention is more prominent. Further, when an active matrix used in a TFT-LCD or TFT-OLED and a driving circuit thereof are formed on the insulating substrate, the driving circuit is configured to surround the active matrix, so that it becomes larger and accordingly its line is also lengthened. As a result, the effect of the present invention is more remarkable.

Further, in the present invention, it is proposed that, when the active matrix is applied to the present invention, internal protective circuits are arranged at corners far from the input terminals among four corners of the active matrix. By such a configuration, it is possible to arrange large-sized protective circuits without making the peripheral area large.

Moreover, in a display device using the semiconductor device of the present invention and an electronic apparatus having the display device, the electro-static damage is difficult to be generated during a manufacturing process, so that it is advantageous in terms of cost, and it is difficult that the voltage drop at the power source occurs, so that there is an effect that the display quality is improved.

DETAILED DESCRIPTION OF EMBODIMENTS

Figure 1:
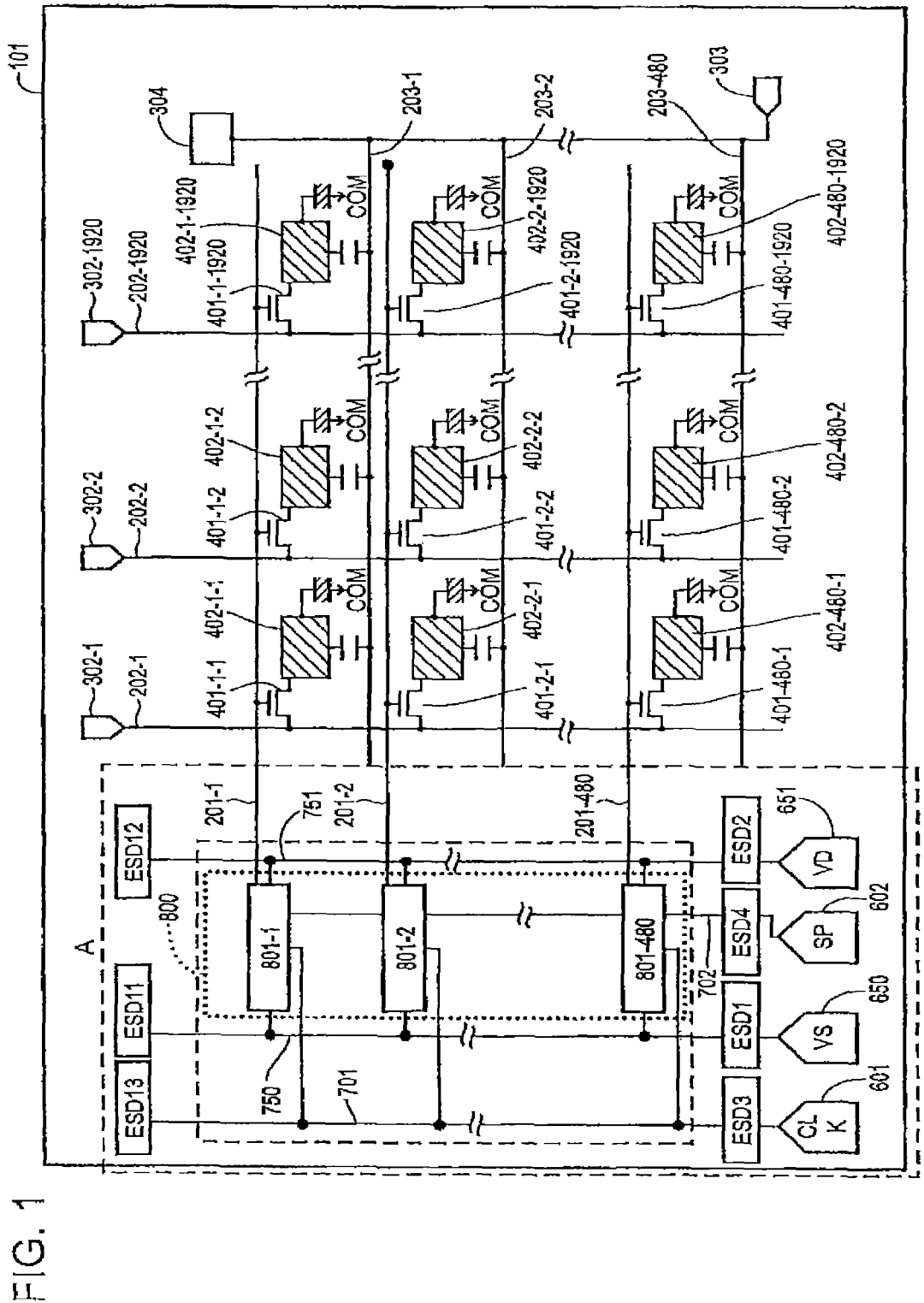
FIG. 1 is a view illustrating a configuration of an active matrix substrate for explaining a first embodiment of the present invention.

FIG. 1 is a view illustrating a configuration of an active matrix substrate having a built-in scanning line driving circuit according to a first embodiment in which a liquid crystal display device using a scanning line driving circuit of the present invention is implemented. 480 scanning lines 201-1 to 201-480 and 1920 data lines 202-1 to 202-1920 are provided orthogonally to each other on an active matrix substrate 101, and 480 capacitance lines 203-1 to 203-480 are alternately arranged in parallel to the scanning lines 201-1 to 201-480. The data lines 202-1 to 202-1920 are connected to data line input terminals 302-1 to 302-1920. The capacitance lines 203-1 to 203-480 are short-circuited from one another to be connected to a common potential input terminal 303. An opposite conductive part 304 is also connected to the common potential input terminal 303.

A pixel switching element 401-*n*-*m* composed of n-channel type electric field effect thin film transistor is formed at each intersection of the scanning line 201-*n* and the data line 202-*m*. Also, its gate electrode is connected to the scanning line 201-*n*, and its source and drain electrodes are connected to the data lines 202-*m* and pixel electrodes 402-*n*-*m*, respectively. The pixel electrode 402-*n*-*m* constitutes a capacitance line 203-*n* and an auxiliary capacitor, and forms a capacitor together with an opposing substrate electrode COM with a liquid crystal element therebetween when it is assembled as a liquid crystal display device.

The scanning lines 201-1 to 201-480 are connected to the scanning line driving circuit 800, which is formed by integrating polysilicon thin film transistors on the active matrix substrate, thereby being supplied to a drive signal. Herein, the scanning line driving circuit is composed of 480 scanning line driving unit circuits 801-1 to 801-480, which are connected to each of the scanning lines. In the present invention, the semiconductor circuit in the scope of claims is the scanning line driving circuit 800. Further, the wiring lines in the scope of claims represents a CLK signal line 701, a SP signal line 702, a high potential power source line 751, and a low potential power source line 750.

The CLK signal line 701, the SP signal line 702, the high potential power source line 751, and the low potential power source line 750 are connected to the scanning line driving circuit 800, to which a clock start pulse signal and the respective power source potentials are supplied. Herein, the CLK signal line 701, the SP signal line 702, the high potential power source line 751 and the low potential power source line 750 are connected to the CLK signal terminal 601, the high potential power source terminal 651 and the lower potential power source terminal 650, and the terminals are connected to an external IC through a FPC, etc. to supply a desired signal and a power source potential.

First to fourth protective circuits ESD1 to ESD4 are connected to a connecting line between the CLK signal terminal 601 and the CLK signal line 701, a connecting line between a SP signal terminal 602 and a SP signal line 702, a connecting line between the high potential power terminal 651 and the high potential power source line 751, and a connecting line between the low potential power terminal 650 and the low potential power source line 750, respectively, thereby preventing TFTs within the scanning line driving circuit 800 from being damaged when the static electricity or noise current is input from each of the terminals 601, 602, 651 and 650.

In addition, fifth to seventh protective circuits ESD11 to ESD13 are disposed at far end of the opposite side, as seen from the CLK signal terminal 601 on CLK signal line 701, the high potential power source terminal 651 on the high potential power source line 751, and the low potential power source terminal 650 on the low potential power source line 750, with a scanning line driving circuit 800 therebetween. Thereby, it is possible to suppress that a unit, (for example, n=1, etc.), located far from a terminal, among scanning line driving unit circuits 801-*n*, is damaged by the static electricity during manufacturing the active matrix substrate. Further, the fifth to seventh protective circuits ESD11 TO ESD13 can be arranged without making the substrate area larger, if arranged at the corner part of the active matrix substrate, particularly, at the corner opposite to the input terminals.

Figure 4:
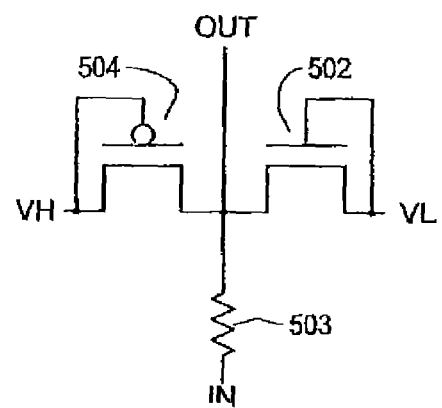
FIG. 4 is a view illustrating a protective circuit for explaining embodiments of the present invention.

FIG. 4 is a view illustrating an example of a specific circuit configuration of protective circuits ESD1 to ESD13. A source electrode and a gate electrode of a p-type transistor 504 are connected to a high potential power source VH, and its drain electrode is connected to a wiring line being protected. A source electrode and a gate electrode of an n-type transistor 502 are connected to a low potential power source VL, and its drain electrode is connected to a wiring line being protected. Here, a signal level given to the wiring line being protected has to be not more than VH and not less than VL. When the potential of the power source being protected is out of the range of VH to VL by static electricity, etc., the n-type transistor 502 or the p-type transistor 504 is turned on, thereby an abnormal current runs through a reference potential VH line or a reference potential VL line. Also, by a protective resistor 503, it is possible to suppress that the potentials of the wiring lines rapidly increase to damage the n-type transistor 502 or the p-type transistor 504. Here, as VH and VL, the highest power source and the lowest power source are used within the circuit, respectively; however, VH=VD and VL=VS are also acceptable.

Further, the protective circuits ESD1 to ESD13 are the same configuration; however, it is possible that each of the protective circuits has a different circuit configuration according to its necessity. Particularly, compared to internal protective circuits ESD11 to ESD13, the protective circuits ESD1 to ESD4 of input part are required to have relatively high protective performance. On this account, for example, it is preferable that the first protective circuit ESD1 has a circuit configuration having protective performance higher than that of the fifth protective circuit ESD11. Specifically, it is preferable that the first protective circuit ESD1 is made to be larger than the fifth protective circuit ESD11 with respect to channel widths of the n-type transistor 502 and the p-type transistor 504.

Figure 5:
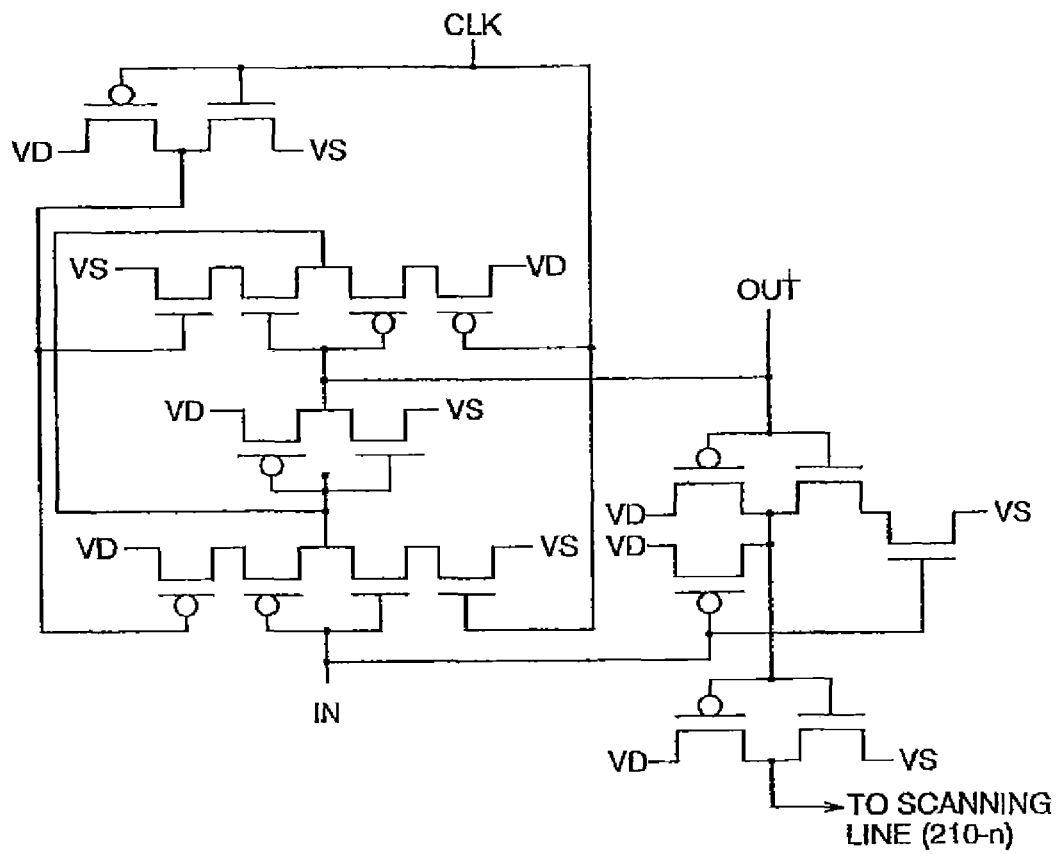
FIG. 5 is a view illustrating a scanning line driving unit circuit for explaining embodiments of the present invention.

FIG. 5 is a view illustrating an example of a configuration of scanning line driving unit circuits 801-1 to 801-480, which is composed of a NAND circuit, a NOT circuit, and a static type shift register using two clock inverters. Further, an OUT terminal of the scanning line driving unit circuit 801-*n* at the nth stage (n<480) is connected to an IN terminal of the scanning line driving unit circuit 801-*n*-1 at the (n−1)th stage, and the IN terminal of the scanning line driving unit circuit 801-480 at the 480th stage is connected to the SP signal line 702.

Figure 6:
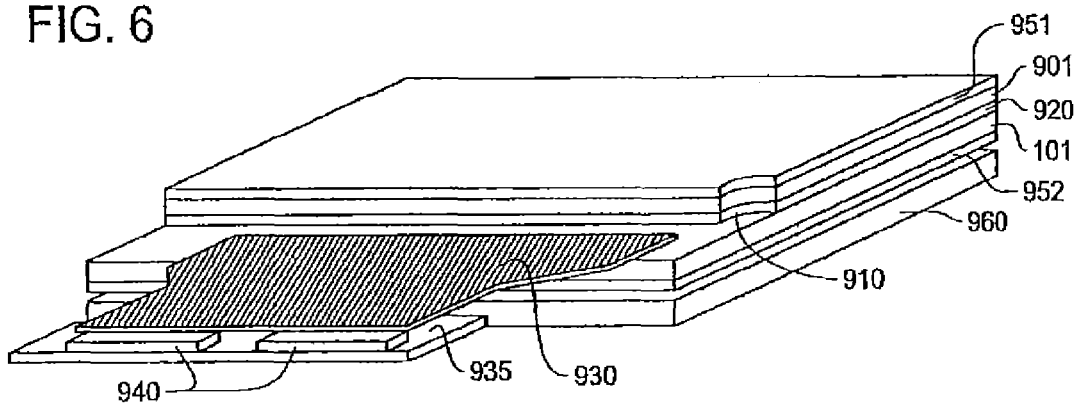
FIG. 6 is a perspective view (partially sectional view) of a liquid crystal display device for explaining the first embodiment of the present invention.

FIG. 6 is a perspective view (partial cross-sectional view) illustrating a configuration of a transmissive liquid crystal display device according to a first embodiment. The active matrix substrate 101 shown in FIG. 1 is attached to an opposite substrate 901, in which common electrodes are formed by creating ITO on a color filter, by sealant 920, and nematic liquid crystal materials 910 are injected therebetween. Further, conductive materials are disposed in the opposite conductive part 304 provided on the active matrix substrate 101, and short-circuit the common electrodes of the opposite substrate 901.

A data line input terminals 302-1 to 302-1920, the common potential input terminal 303, the CLK signal terminal 601, the SP signal terminal 602, the high potential power source terminal 651, the lower potential power source terminal 650 are connected to one or a plurality of external ICs 940 through a FPC 930 mounted on the terminals to be supplied with a necessary electrical signal and potential.

Furthermore, an upper deflection plate 951 is disposed at the external side of the active matrix substrate, and a lower deflection plate 952 is disposed at the external side of the opposite substrate. They are disposed in such a way that polarizing directions thereof are perpendicular to each other (crossed-Nicol). Also, a backlight 960 is attached to the lower deflection plate 952, so a liquid crystal display device is completed. The back light 960 may be a cold cathode tube to which a light guiding plate or a dispersion plate is attached, or a unit where an entire surface emits light by an EL element. Although it is not shown, the surrounding may be covered by an outer shell, or a protective glass or an acryl plate may be attached above the upper deflection plate, as needed.

In the liquid crystal display device, as compared to the conventional art, it is difficult that the electrostatic damage caused by the static electricity, etc. is generated during the manufacturing process or after the completion thereof. Therefore, the yield is good and the reliability is high.

Second Embodiment

Figure 2:
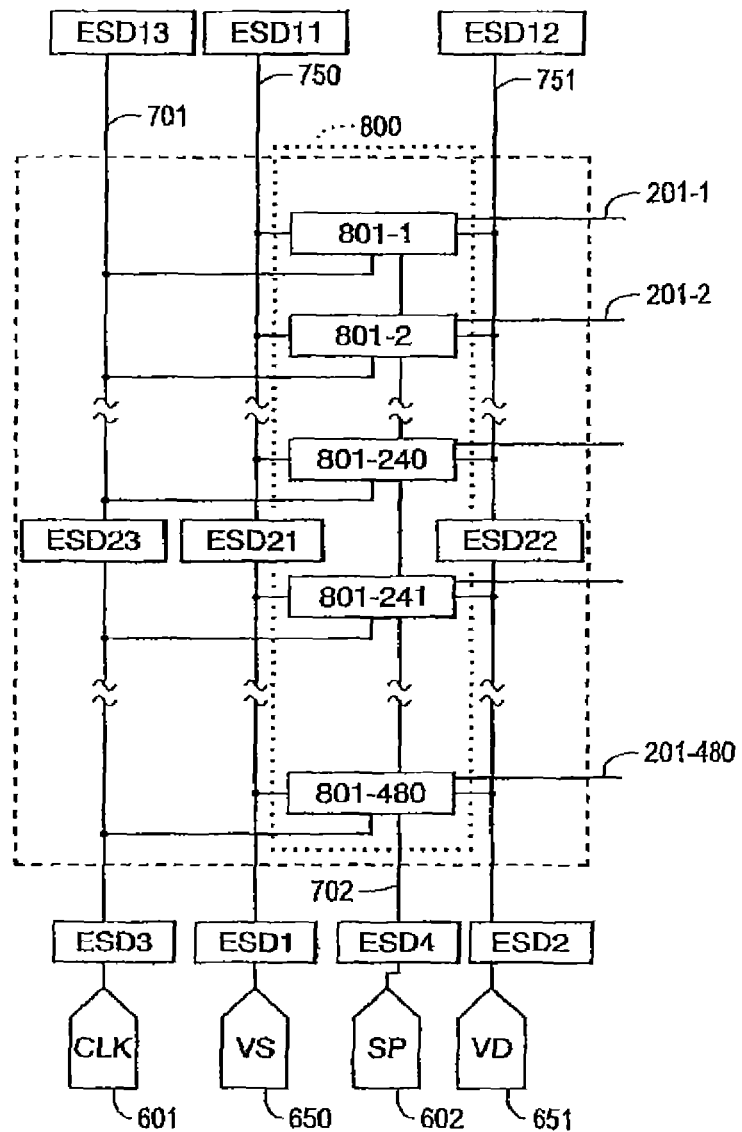
FIG. 2 is a view illustrating a scanning line driving circuit for explaining a second embodiment of the present invention.

FIG. 2 is a view illustrating a configuration of a driving circuit in a second embodiment implementing a liquid crystal display device using the scanning line driving circuit of the present invention. The figure is a diagram corresponding to the inside of the frame indicated by broken lines A of FIG. 1.

In the present embodiment, not only the input part protective circuits ESD1 to ESD3 between the terminals 601, 650 and 651 and the scanning line driving circuit 800, and the internal protective circuits ESD11 to ESD13 located at the far end with the driving circuit 800 therebetween as seen from the input terminals 601, 605 and 651, but also eighth to tenth protective circuits ESD21 to ESD23 are provided between the unit driving circuit 801-240 at the 240th stage, which is an intermediate stage of the driving circuit 800, and the unit driving circuit 801-241 at the 241st stage. Thereby, it is possible to suppress the damage caused by static electricity in the vicinity of the intermediate stage (n=240), which is far from both the vicinity of the terminal and the far end of the terminal. In the present embodiment, the protective circuits are added only to the intermediate stage, but it is possible to increase the number of the protective circuits to be interposed in accordance with the size, etc. of the circuit. For example, in addition to the locations of the present embodiment, more preferably, the protective circuits are interposed between the 120th stage (801-120) and the 121st stage (801-121), and between the 360th stage (801-360) and the 361st stage (801-361). Most preferably, the protective circuits are interposed between all stages if there is no problem in the circuit area. However, in any case, a distance when interposing the protective circuits should be approximately equal; otherwise, it is easy that the electrostatic damage occurs only in a place where the distance is large.

With respect to the configuration of the active matrix substrate and the details of the protective circuits or the driving circuit in a place other than the above specified place, the second embodiment is the same as the first embodiment. Also, for the liquid crystal display device using the active matrix substrate including the circuit shown in FIG. 2, the configuration is the same as in the first embodiment, so the explanation is omitted.

Third Embodiment

Figure 3:
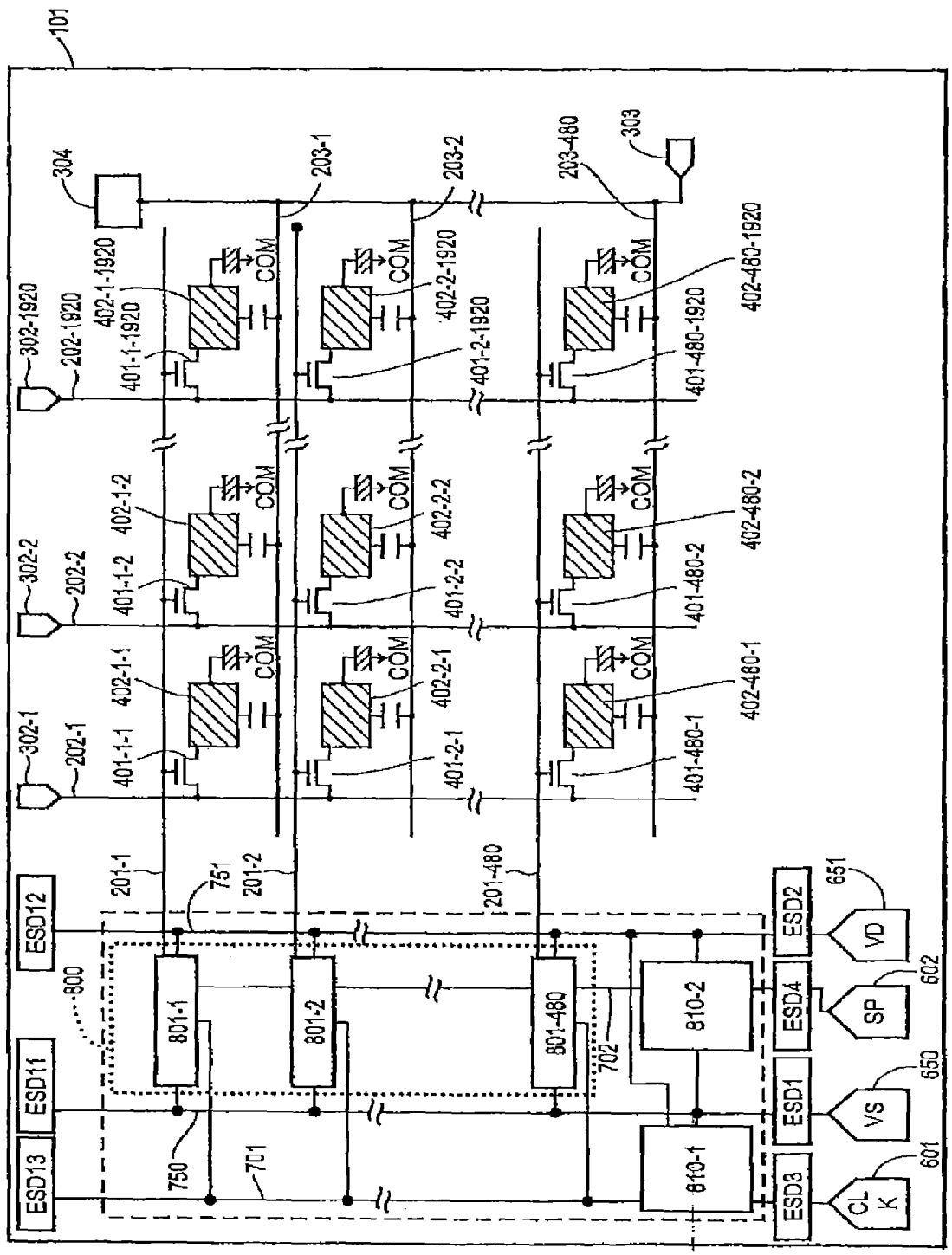
FIG. 3 is a view illustrating a configuration of an active matrix substrate for explaining a third embodiment of the present invention.

FIG. 3 is a view illustrating a configuration of an active matrix substrate having formed with a scanning line driving circuit in a first embodiment implementing a liquid crystal display device using the scanning line driving circuit of the present invention.

In the present embodiment, different from the first and second embodiments, a CLK signal and a SP signal applied to the scanning line driving circuit 800 are not directly input from the CLK signal terminal 601 and the SP signal terminal 602, but, after driving capability is temporarily amplified at buffer circuits 810-1 and 810-002, they are input to the scanning line driving circuit 800. By such a configuration, even if the signal driving capability of the external IC is not so high, it is possible to drive the signal without a significant delay even in a panel having a large area.

Figure 7:
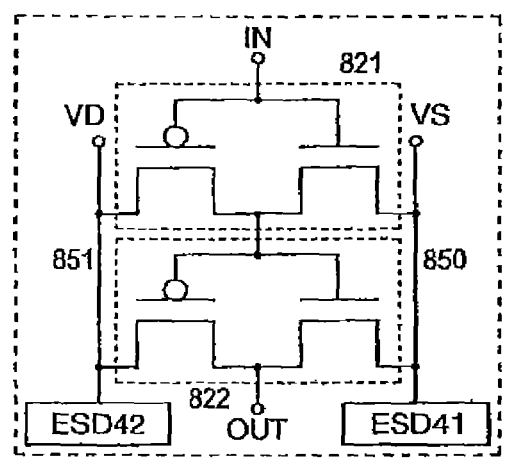
FIG. 7 is a view illustrating a buffer circuit for explaining the third embodiment of the present invention.

FIG. 7 is a detailed view illustrating a configuration of the buffer circuits 810-1 and 810-2 in a third embodiment. A first NOT circuit 821 and a second NOT circuit 822 are connected in series by two stages. The transistor constituting the second NOT circuit 822 has a channel width (W) wider than the transistor constituting the first NOT circuit 821. For example, the first NOT circuit 821 is set to be W=250 mm, and the second NOT circuit 822 is set to be W=1000 mm. A power line 850 is a branch line branching from the low potential power source line 750 of FIG. 3, and the power source line 851 is a branch line branching from the high potential power source line 751 of FIG. 3. White circles indicate branching point directions, and eleventh and twelfth circuits ESD41 and ESD42 are disposed at the opposite side, i.e., at the end of the branch lines 850 and 851, with the buffer circuits 810-1 and 810-2 interposed therebetween.

In such a configuration, the buffer circuits 810-1 and 810-2 are connected to a part between the first protective circuit ESD11 and the eleventh protective circuit ESD 41 on the low potential power source line 750 and the a part between the second protective circuit ESD12 and the twelfth protective circuit ESD 42 on the high potential power source line 751, so the protective performance when the static electricity is charged within the buffer circuit 810-1 and 810-2 is remarkably improved as compared to the case in which there is only the first protective circuit ESD11.

Figure 8:
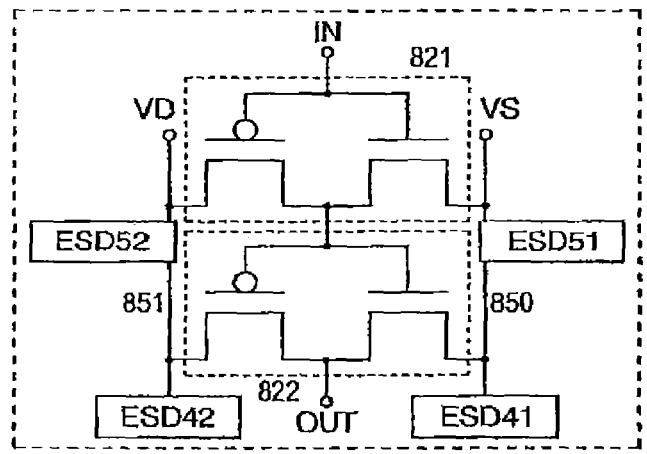
FIG. 8 is a view illustrating a buffer circuit for explaining another example of the third embodiment of the present invention.

FIG. 8 is a detailed view illustrating another example of a configuration of the buffer circuits 810-1 and 810-2 in the third embodiment. As compared to the configuration of FIG. 7, a 13th protective circuit ESD51 and a 14th protective circuit ESD 52 are added on the wiring line connecting a connection point of a first NOT circuit 821 with a connection point of a second NOT circuit 822 provided on the low potential power source line 750 and the high potential power source line 751. The other configuration is the same as in FIG. 7. As such, there are also internal protective circuits in the intermediate points between circuits, and thus the protective performance is more improved.

Further, in this embodiment, there is another effect that the voltage change in power source is suppressed. The resistance of the power source line is limited. Thus, when a large current is instantaneously consumed in a complementary circuit, the voltage is changed even if it is partial and instantaneous. According to the present embodiment, the channel width of the second NOT circuit 822 is W=1000 mm, which is extremely large, and an extremely large current instantaneously flows to change the potential of the power source when the input signal is inverted (the time depends on the capacitance value of the wiring line to which the output terminal of the second NOT circuit 822 is connected).

Figure 10:
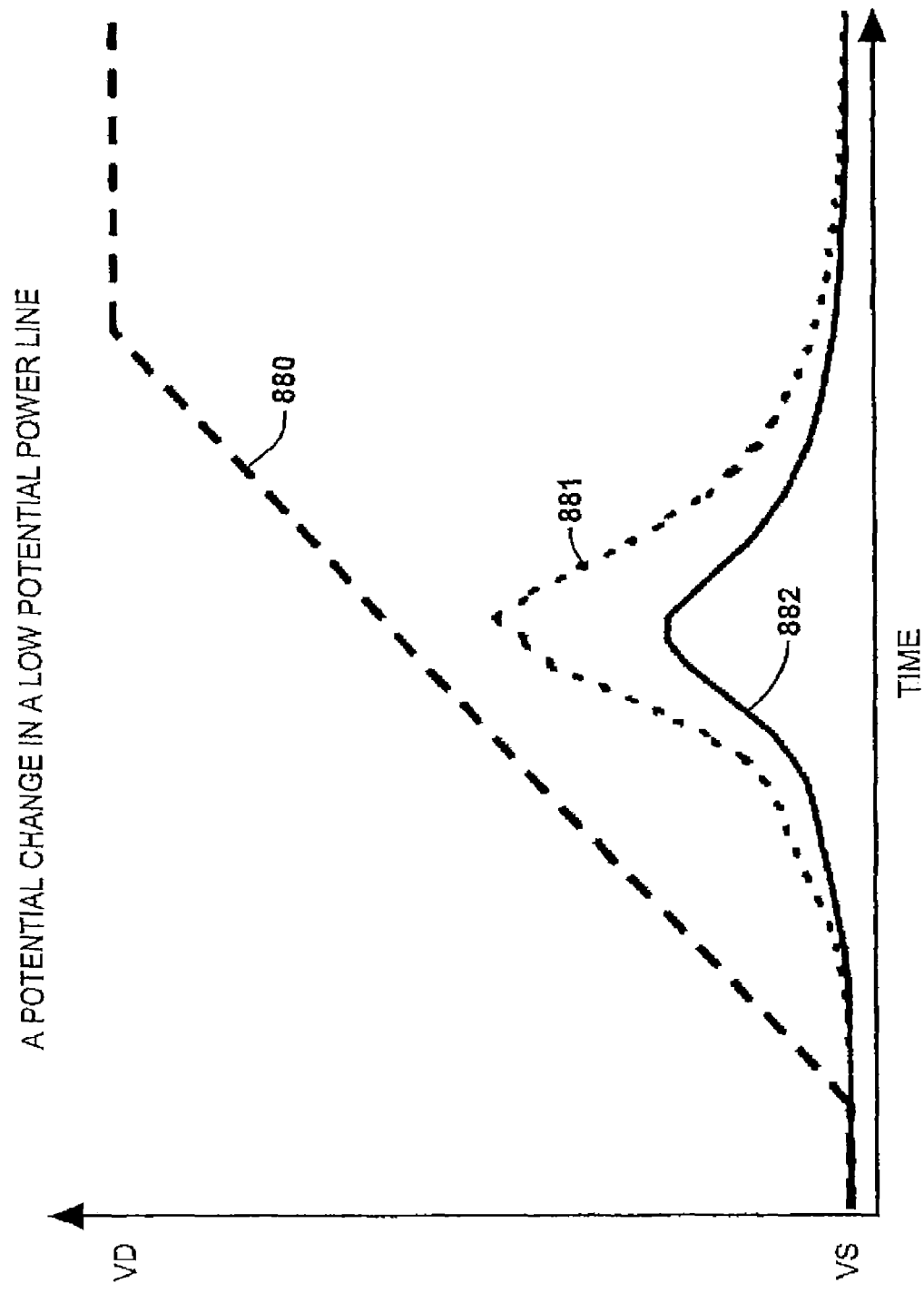
FIG. 10 is a graph illustrating a simulation result of a reference potential change for explaining the third embodiment of the present invention.
Figure 11:
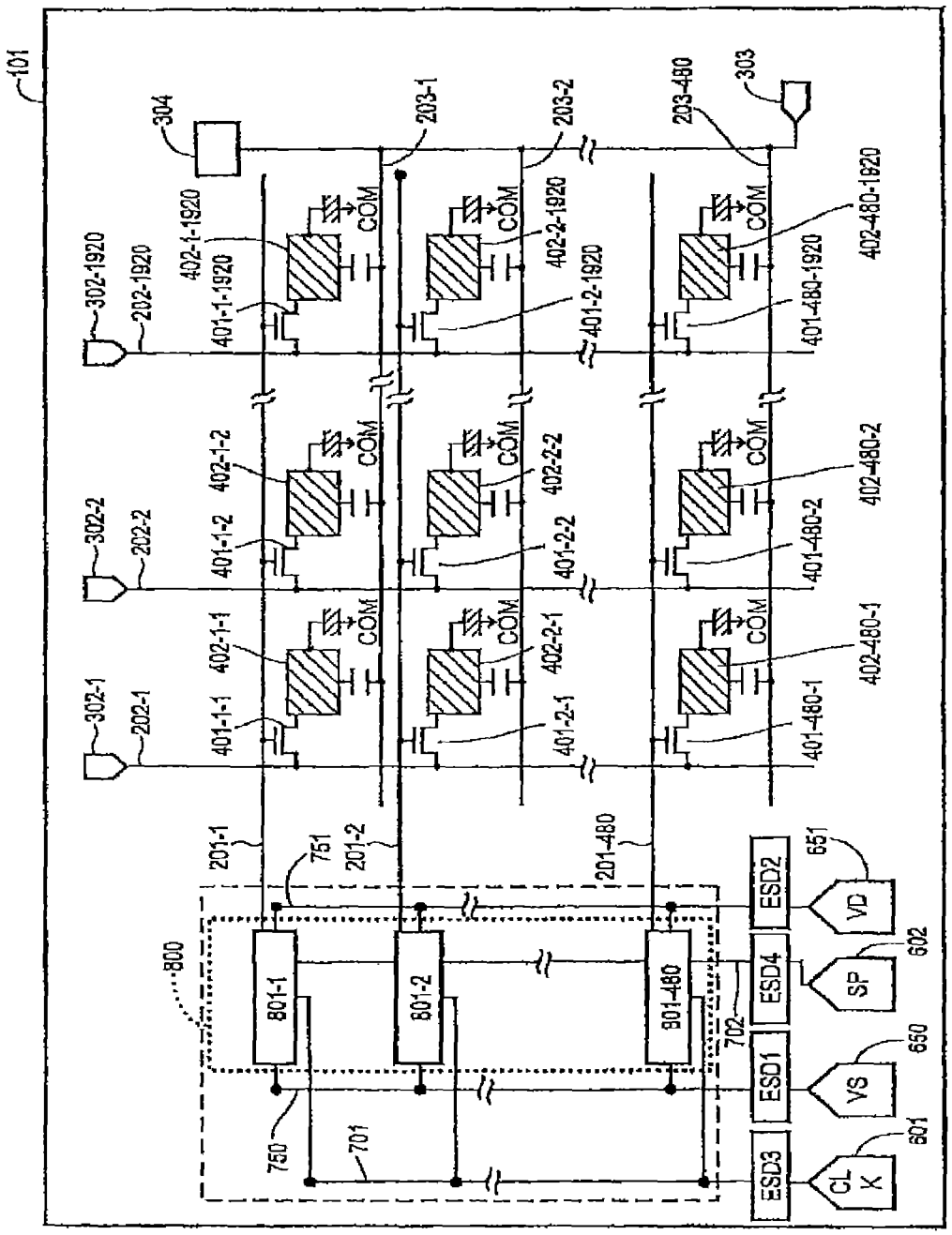
FIG. 11 is a view illustrating a configuration of an active matrix substrate for explaining the conventional example.

FIG. 10 is a view illustrating a simulation result of potential change with respect to time in the buffer circuit of FIG. 7 and FIG. 8. Hereinafter, the present embodiment will be described in detail by referring to FIG. 10. Graph 880 shows a waveform of the signal which is output from the first NOT circuit 821 and input to the second NOT circuit 822, in which the potential is changed from VS to VD. At this time, the n-type transistor constituting the second NOT circuit 822 is turned on to apply the potential of the output terminal to VS. At this time, a large current flows in the low potential power source line 850, so a voltage gradient is generated. As a result, the potential instantaneously increases slightly. In order to suppress this, it is preferable to widen the line width of the low potential power source line 850, but it may be limited due to the circuit area. The graph 881 shows the potential around the second NOT circuit 822 of the low potential power source line 850, when the low potential power source line 850 is fixed as a predetermined line width, especially, when countermeasures are not taken, and it can be seen that the voltage instantaneously increases.

When such a phenomenon occurs, the driving capability of the buffer circuit is deteriorated, and it is possible to have an adverse effect on other circuits connected to the low potential power source line 850. In other words, the voltage drop as in graph 881 is transmitted to other circuits through the low potential power source line 850, thereby causing malfunction in the worst case. As a result, it affects the output precision in the case of an analog circuit. Such a problem is more conspicuous in a TFT circuit on an insulating substrate, which has a circuit area larger than that of a circuit on a silicon wafer, especially, in the driving circuit of the display device.

Next, the graph 882 shows a result of the case in which an appropriate capacitative element is added to the low potential power source line. In this case, the current instantaneously flowing is supplied from the capacitative element to some degree, so the voltage drop is small. In other words, in order to reduce the voltage drop, the capacitative element is preferably added to the power source line. The larger the capacitance of the capacitative element is, the greater the effect of reducing the voltage drop is. However, according to the inventor of the present invention, if the maximum current flowing in the power source line is I (A) and the tolerance time when a voltage drop occurs is t (second), the capacitative element having a capacitance not less than I×t×0.1 (F) was effective on the voltage drop. On the other hand, the capacitative element having a capacitance not more than I×t×0.1 (F) was not significantly effective on the voltage drop. Here, the tolerance time t when the voltage drop is generated is determined by the maximum operation speed of a logical circuit or sampling time of an analog circuit. Generally, in the TFT using a polysilicon, the operation speed is not so high and the limit of the maximum operation is several 10 MHz at most. In other words, the power source voltage change not more than 10 n second almost causes no problem. Further, the maximum current flowing in the power source is the same as the maximum instantaneous current consumption of the circuit.

Accordingly, when the maximum current consumption in the circuit is I (A) and the tolerance time when the voltage drop is generated is t (second), it is effective on reduction of the voltage drop if a capacitance not less than I×t×0.1 (F) to the power source. At that time, the time is preferably t £10-8 (second). Further, it is preferable that another power source line of which the potential is not changed is connected to the capacitance. However, when such a capacitance is provided, the circuit area increases. As such, when a plurality of protective circuits are disposed on the power line as in this embodiment, a capacitance is generated between the power source line being protected and the reference potential power source lines VH and VL by the capacitative components on the protective circuits. In this case, since the circuit also functions as a protective circuit or as a measure against the power source potential change, it is significantly advantageous in terms of the circuit area.

When a reduction of such a power source potential drop change is expected, it is necessary to provide the protective circuits near the circuit of which a current consumption is large. Otherwise, a voltage change still occurs by the power source line resistance between the circuit having a large current consumption and the protective circuits. Specifically, the distance (X) of the power source line from the circuit having a large current consumption to the protective circuits should be smaller than the distance (Y) of the power source line from the circuit having a large current consumption to the input terminals.

Figure 9:
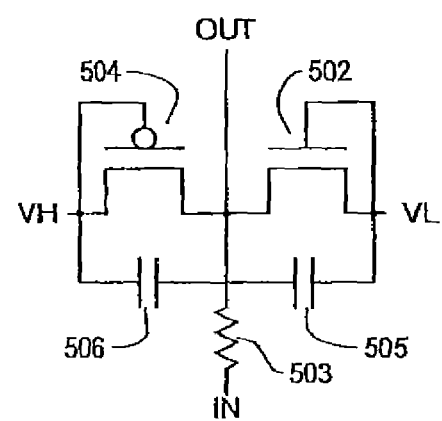
FIG. 9 is a view illustrating a protective circuit for explaining the third embodiment of the present invention.

The specific configurations of the first to second, and the eleventh to fourteenth protective circuits ESD1 to ESD2, and ESD11 to ESD14, respectively, is preferably the same as in FIG. 4 or 9. The explanation on the circuit configuration of FIG. 4 is omitted since it is the same as in the first embodiment. However, even in this configuration, the capacitance is added between the wiring line protected by the gate-drain capacitance component of the transistor and the high potential power source VH and the lower potential power source VL. In the configuration of FIG. 9, compared to the configuration of FIG. 4, the first capacitance 505 and the second capacitance 506 are added. Thus, when a strong voltage is instantaneously applied, they are combined with the protective resistor 503 to operate as a CR circuit. Thereby, a function is improved, which suppresses the n-type transistor 502 and the p-type transistor 504 from being damaged. Also, since the capacitances between the protective line and the high potential power source VH, and between the protective line and the low potential power source VL can be adjusted by the first capacitance 505 and the second capacitance 506. Thus, it is an effective configuration as a measure against the power source voltage drop.

Furthermore, in such a configuration, the capacitance of the protective circuits ESD1, ESD2, ESD11 and ESD12 connected to the low potential power source line 750 and the high potential power source line 751 should be smaller than the capacitance of the protective circuits ESD3, ESD4 and ESD13 connected to the signal lines 701 and 702. The reason is that the potential of the signal line is changed, so if the capacitance between the signal line and the protective circuit is too large, a cross-talk is generated between the protective circuit and the reference power source line connected to the signal line. Specifically, if the configuration of the protective circuits is the same as in FIG. 9, the first capacitance 505 and the second capacitance 506 of the protective circuits (ESD1, ESD2, ESD11, and ESD12) connected to the low potential power source line 750 and the high potential power source line 751 are preferably set to be larger than the first capacitance 505 and the second capacitance 506 of the protective circuits ESD3, ESD4 and ESD13 connected to the signal lines 701 and 702.

Even in a case of forming a complementary circuit other than the buffer circuit described in the present embodiment, such as a data line driving circuit, DAC circuit, power circuit, level shift circuit, memory circuit, etc. on the active matrix substrate, it is preferable to provide the protective circuits at the end or intermediate of a branched power line, and it is more preferable that all circuits are located on the power line between protective circuits. Also, it is preferable in terms of reduction of the power noise that protective circuits having a capacitance not less than a predetermined value are provided at the front and rear ends of the circuit having high current consumption. Specifically, when the current consumption of the circuit is I and the tolerable time when the voltage drop occurs (typically, $t \leq 10^{-8}$ (second)), it is preferable to have the capacitance not less than $I \times t \times 0.1$ (F)).

With respect to the configuration of the active matrix substrate and the details of the protective circuits or the driving circuit in a place other than the above specified place, the third embodiment is the same as the first embodiment. Also, for the liquid crystal display device using the active matrix substrate shown in FIG. 3, the configuration is the same as in the first embodiment, so that the explanation is omitted.

Further, in the first embodiment, only the protective circuit of FIG. 4 has been described, however, it is possible to obtain the same effect as in the third embodiment by providing the protective circuit of FIG. 9.

INDUSTRIAL APPLICABILITY

The present invention is not limited to the above-mentioned embodiments, but it can be also applicable to a liquid crystal display using an active matrix substrate formed with a data line driving circuit, a DAC, a power circuit, etc. In this case, the present invention may be applicable to each of the circuits, or it may be applied to some of the circuits if there is any problem in layout, and so on. In case of applying it to the scanning line driving circuit, various sequential selection circuits as well as the shift register circuit as in the embodiment are possible.

Further, the protective circuits can have the same configuration as in the embodiment and foregoing examples, and any configurations which have been suggested so far can be used.

Further, instead of a polysilicon transistor, an amorphous silicon thin film transistor may be used. Also, instead of a thin film transistor formed on the insulating substrate, an active matrix substrate may be used, in which a pixel switching element or a driving circuit is formed on a crystal silicon wafer.

Further, as a liquid crystal display device, it may be a reflective type or a transflective type instead of the transmission type, and it may be a projection type light value instead of a direct viewing type light value. Also, a normally black mode can be used instead of a normally white mode as in the embodiment. Especially, in this case, a vertical alignment mode or a horizontal electric field switching mode may be possible as an alignment mode of the liquid crystal.

What is claimed is:

1. A display device comprising:
   a substrate;
   an active matrix arranged on the substrate;
   a driving circuit arranged along one side interposed between a first corner of the substrate and a second corner of the substrate at a peripheral area that surrounds the active matrix;
   a first buffer circuit arranged at the first corner and connected to the driving circuit;
   a first signal line connected to a first terminal and the first buffer circuit and supplying a driving signal to the first buffer circuit, the first buffer circuit configured to supply the driving signal to the driving circuit;
   a first power source line connected to a second terminal and the driving circuit, the first power source line being arranged along the one side at the peripheral area and supplying a driving voltage to the driving circuit;
   a first protective circuit arranged at the first corner and connected to the first signal line at the first corner; and
   a second protective circuit arranged at the second corner and connected to the first power source line at the second corner,
   wherein the first buffer circuit and the driving circuit are positioned between the first protective circuit and the second protective circuit.

2. The display device according to claim 1, further comprising:
   a second buffer circuit arranged at the first corner and connected to the driving circuit; and
   a second signal line connected to a third terminal and the second buffer circuit and supplying a second driving signal to the second buffer circuit, the second buffer circuit configured to supply the second driving signal to the driving circuit.

3. The display device according to claim 2, further comprising:
   a third protective circuit arranged at the first corner and connected to the second signal line at the first corner; and
   wherein the second buffer circuit is positioned between the third protective circuit and the driving circuit.

4. The display device according to claim 1, further comprising:
   a fourth protective circuit arranged at the second corner and connected to the first signal line at the second corner.

5. The display device according to claim 1, further comprising:
   a fifth protective circuit arranged at the first corner and connected to the first power source line at the first corner.

6. The display device according to claim 1, wherein the first signal line is arranged between the one side and the driving circuit at the peripheral area of the substrate.

7. The display device according to claim 1, wherein the first terminal and the second terminal are arranged along a first side of the substrate close to the first corner.

8. The display device according to claim 1, wherein the first power source line is arranged between the active matrix and the driving circuit at the peripheral area of the substrate.

9. The display device according to claim 1, wherein the driving circuit is a scanning line driving circuit.

10. The display device according to claim 1, wherein the driving circuit is a data line driving circuit.

11. An electronic apparatus having the display device according to claim 1.

12. A display device comprising:
a substrate;
an active matrix arranged on the substrate;
a driving circuit arranged along one side interposed between a first corner of the substrate and a second corner of the substrate at a peripheral area that surrounds the active matrix;
a first buffer circuit arranged at the first corner and connected to the driving circuit;
a first signal line arranged between the one side and the driving circuit at the peripheral area and supplying a driving signal to the first buffer circuit, the first buffer circuit configured to supply the driving signal to the driving circuit;
a first power source line arranged between the one side and the active matrix at the peripheral area and connected to the driving circuit;
a first input terminal arranged at the peripheral area and connected to the first signal line, the first signal line being supplied the driving signal through the first input terminal;
a second input terminal arranged at the peripheral area and connected to the first power source line, the first power source line being supplied a power source potential through the second input terminal;
a first protective circuit arranged at the first corner and connected to the first signal line at the first corner;
a second protective circuit arranged at the second corner and connected to the first signal line at the second corner;
a third protective circuit arranged at the first corner and connected to the first power source line at the first corner; and
a fourth protective circuit arranged at the second corner and connected to the first power source line at the second corner,
wherein the first buffer circuit and the driving circuit are positioned between the first protective circuit and the second protective circuit.

13. The display device according to claim 12, further comprising:
a second buffer circuit arranged at the first corner and connected to the driving circuit; and
a second signal line connected to a third terminal and the second buffer circuit and supplying a second driving signal to the second buffer circuit, the second buffer circuit configured to supply the second driving signal to the driving circuit.

14. The display device according to claim 13, further comprising:
a fifth protective circuit arranged at the first corner and connected to the second signal line at the first corner; and
wherein the second buffer circuit is positioned between the fifth protective circuit and the driving circuit.

15. The display device according to claim 13, wherein the first terminal, the second terminal and the third terminal are arranged along a first side of the substrate close to the first corner.

16. The display device according to claim 12, wherein the driving circuit is a scanning line driving circuit.

17. The display device according to claim 12, wherein the driving circuit is a data line driving circuit.

18. An electronic apparatus having the display device according to claim 12.

* * * * *